(12) United States Patent
Lu

(10) Patent No.: US 11,482,445 B2
(45) Date of Patent: Oct. 25, 2022

(54) METHOD FOR MANUFACTURING SEMICONDUCTOR STRUCTURE

(71) Applicant: NANYA TECHNOLOGY CORPORATION, New Taipei (TW)

(72) Inventor: Li-Han Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/344,567

(22) Filed: Jun. 10, 2021

(65) Prior Publication Data

US 2021/0305088 A1 Sep. 30, 2021

Related U.S. Application Data

(62) Division of application No. 16/419,479, filed on May 22, 2019, now Pat. No. 11,094,578.

(51) Int. Cl.
*H01L 21/762* (2006.01)
*H01L 27/12* (2006.01)
*H01L 29/06* (2006.01)

(52) U.S. Cl.
CPC .. *H01L 21/76224* (2013.01); *H01L 21/76283* (2013.01); *H01L 27/1203* (2013.01); *H01L 29/0649* (2013.01)

(58) Field of Classification Search
CPC ......... H01L 21/76224; H01L 21/76283; H01L 27/1203; H01L 29/0649
See application file for complete search history.

(56) References Cited

U.S. PATENT DOCUMENTS

| 7,078,298 B2 | 7/2006 | Lee et al. |
| 9,536,991 B1 | 1/2017 | Zang et al. |

(Continued)

FOREIGN PATENT DOCUMENTS

| TW | 488033 B | 5/2002 |
| TW | 377669 B | 11/2012 |

OTHER PUBLICATIONS

Office Action dated Oct. 20, 2020 in TW Application No. 108127015 (5 pages).

(Continued)

*Primary Examiner* — Nathan W Ha
(74) *Attorney, Agent, or Firm* — Muncy, Geissler, Olds & Lowe, P.C.

(57) ABSTRACT

The present disclosure provides a method for manufacturing a semiconductor structure having different filling layers. The method includes forming a multi-layer stack in a semiconductor substrate, wherein the multi-layer stack has a first filling layer and a second layer, the semiconductor substrate has two through vias, and two top portions of the multi-layer stack are respectively exposed through the two through vias. The method further includes recessing the multi-layer stack from the two through vias to respectively form two blind holes in the first filling layer and the second filling layer; selectively etching the second filling layer to form a global cavity between the two blind holes; filling the global cavity and the two blind holes with dielectric filling material to form an air void in the multi-layer stack; and forming a switch device over the semiconductor substrate, wherein the air void is formed under the switch device.

10 Claims, 4 Drawing Sheets

(56) References Cited

U.S. PATENT DOCUMENTS

| | | |
|---|---|---|
| 9,590,118 B1 | 3/2017 | Smith et al. |
| 10,083,964 B1 | 9/2018 | Reznicek et al. |
| 10,529,826 B1 * | 1/2020 | Frougier .......... H01L 29/41775 |
| 10,559,593 B1 | 2/2020 | Metze et al. |
| 10,636,842 B1 * | 4/2020 | Cheng ............... H01L 27/2463 |
| 10,643,927 B1 * | 5/2020 | Shank ............... H01L 21/76898 |
| 2006/0105522 A1 | 5/2006 | Steimle et al. |
| 2010/0035403 A1 | 2/2010 | Brown et al. |
| 2011/0108942 A1 | 5/2011 | Fenouillet-Beranger et al. |
| 2012/0187488 A1 | 7/2012 | Grenouillet et al. |
| 2012/0190214 A1 | 7/2012 | Vinet et al. |
| 2014/0091281 A1 | 4/2014 | Cheng et al. |
| 2014/0175659 A1 | 6/2014 | Lee et al. |
| 2015/0076559 A1 | 3/2015 | Frohberg et al. |
| 2015/0294984 A1 | 10/2015 | Cheng et al. |
| 2015/0340273 A1 | 11/2015 | Jaffe et al. |
| 2015/0348825 A1 | 12/2015 | Hebert |
| 2015/0357432 A1 | 12/2015 | Lin et al. |
| 2016/0163858 A1 | 6/2016 | Kim et al. |
| 2016/0247882 A1 | 8/2016 | Jun et al. |
| 2018/0083009 A1 | 3/2018 | Booth, Jr. et al. |
| 2019/0081138 A1 | 3/2019 | Liu et al. |
| 2019/0148219 A1 | 5/2019 | Yen et al. |
| 2020/0006480 A1 * | 1/2020 | Huang ............. H01L 29/66522 |
| 2020/0006652 A1 * | 1/2020 | Cheng ................. H01L 45/06 |
| 2020/0066867 A1 | 2/2020 | Cheng et al. |
| 2020/0105782 A1 * | 4/2020 | Guo ................. H01L 27/11582 |
| 2020/0105788 A1 * | 4/2020 | Majhi ................ H01L 29/6684 |
| 2020/0126843 A1 * | 4/2020 | Tsai .................... H01L 29/6653 |
| 2020/0127109 A1 * | 4/2020 | Wang ................. H01L 21/7682 |

OTHER PUBLICATIONS

Destefanis et al., "HCl Selective Etching of $Si_{1-x}GE_x$ versus Si for Silicon On Nothing and Multi Gate Devices," ECS Transaction, 16 (10) (13 pages).

* cited by examiner

METHOD FOR MANUFACTURING SEMICONDUCTOR STRUCTURE

CROSS-REFERENCE TO RELATED APPLICATION

This application is a divisional application of U.S. Non-Provisional application Ser. No. 16/419,479 filed May 22, 2019, which is incorporated herein by reference in its entirety.

TECHNICAL FIELD

The present disclosure relates to a method for manufacturing a semiconductor structure, and more particularly, to a method for manufacturing a semiconductor structure having different filling layers with different etching rates embedded in a semiconductor substrate.

DISCUSSION OF THE BACKGROUND

Semiconductor devices are essential for many modern applications. With the advancement of electronic technology, semiconductor devices are steadily becoming smaller and smaller while providing greater functionality and including greater amounts of integrated circuits. Due to the miniaturized scale of semiconductor devices, a conventional semiconductor structure including a silicon on insulator (SOI) structure is provided to increase the isolation effect, so that the semiconductor structure can reduce the parasitic capacitance effect and increase the switching speed.

The conventional semiconductor structure includes a semiconductor substrate, an insulator layer buried in the substrate, and a switch device disposed over the insulator layer and the semiconductor substrate.

However, as semiconductor devices become smaller and smaller, the capacitance remaining in the semiconductor device may result in capacitance disturbance and reduced switching speed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a semiconductor substrate, a multi-layer stack, a switch device, and an air void. The multi-layer stack is buried in the semiconductor substrate. The multi-layer stack includes a first filling layer and a second filling layer under the first filling layer, the first filling layer has a first etching rate, the second filling layer has a second etching rate, and the first etching rate and the second etching rate are different. The switch device is disposed over the semiconductor substrate. The air void is thrilled in the multi-layer stack and under the switch device. The air void is surrounded by dielectric filling material.

In some embodiments, the second etching rate is greater than the first etching rate.

In some embodiments, the multi-layer stack further includes a third filling layer disposed beneath the second filling layer, wherein the third filling layer has a third etching rate different from the second etching rate.

In some embodiments, the second etching rate is greater than the first etching rate and the third etching rate.

In some embodiments, the air void is formed in the location of the second filling layer.

In some embodiments, the semiconductor substrate includes an underlying substrate and an epitaxial semiconductor layer disposed over the underlying substrate, wherein the multi-layer stack is buried in the underlying substrate, and the epitaxial semiconductor layer is disposed between the multi-layer stack and the switch device.

In some embodiments, the semiconductor structure further comprises a well portion embedded in the epitaxial semiconductor layer, wherein the well portion is disposed under the switch device and over the air void.

In some embodiments, the semiconductor structure further comprises an etch stop layer disposed between the epitaxial semiconductor layer and the multi-layer stack.

In some embodiments, the semiconductor structure further comprises: two shallow trench isolation portions disposed in the semiconductor substrate, wherein the switch device is disposed laterally between the shallow trench isolation portions; and two deep trench isolation portions disposed in the semiconductor substrate and respectively under the shallow trench isolation portions, wherein the multi-layer stack is disposed laterally between the deep trench isolation portions.

In some embodiments, the semiconductor structure further comprises a dielectric layer disposed over the semiconductor substrate and surrounding the switch device.

Another aspect of the present disclosure provides a method for manufacturing a semiconductor structure. The method includes forming a multi-layer stack in a semiconductor substrate, wherein the multi-layer stack has a first filling layer and a second filling layer under the first filling layer, the first filling layer has a first etching rate, the second filling layer has a second etching rate, the first etching rate and the second etching rate are different, the semiconductor substrate has two through vias, and two top portions of the multi-layer stack are respectively exposed through the two through vias; recessing the multi-layer stack from the two through vias to respectively form two blind holes in the first filling layer and the second filling layer; selectively etching the second filling layer to form a global cavity between the two blind holes; filling the global cavity and the two blind holes with dielectric filling material to form an air void in the multi-layer stack; and forming a switch device over the semiconductor substrate, wherein the air void is formed under the switch device.

In some embodiments, the method further comprises: forming a third filling layer of the multi-layer stack in the semiconductor substrate beneath the second filling layer, wherein the third filling layer has a third etching rate different from the second etching rate.

In some embodiments, the air void is formed in the location of the second filling layer and surrounded by dielectric filling material.

In some embodiments, the method further comprises: forming an epitaxial semiconductor layer of the semiconductor substrate over an underlying substrate of the semiconductor substrate, wherein the multi-layer stack is thrilled in the underlying substrate, and the epitaxial semiconductor layer is formed between the multi-layer stack and the switch device.

In some embodiments, the method further comprises: forming a well portion embedded in the epitaxial semiconductor layer, wherein the well portion is formed under the switch device and over the air void.

In some embodiments, the method further comprises: forming an etch stop layer between the epitaxial semiconductor layer and the multi-layer stack.

In some embodiments, the method further comprises: forming two deep trench isolation portions in the semiconductor substrate, wherein the multi-layer stack is formed laterally between the deep trench isolation portions; and forming two shallow trench isolation portions in the semiconductor substrate and respectively above the deep trench isolation portions, wherein the switch device is formed laterally between the shallow trench isolation portions.

In some embodiments, the method further comprises: forming a dielectric layer over the semiconductor substrate and surrounding the switch device.

In some embodiments, the method further comprises: providing an underlying substrate of the semiconductor substrate before forming a multi-layer stack in the semiconductor substrate, wherein the underlying substrate has the two through vias; and forming two local trenches respectively under the two through vias.

In some embodiments, the method further comprises: forming a global trench between the two local trenches in the underlying substrate of the semiconductor substrate; and filling the global trench and the two local trenches to form the multi-layer stack in the underlying substrate of the semiconductor substrate.

With the design of the semiconductor structure, the semiconductor structure has an air void formed in the semiconductor substrate. The air void can provide the switch device with an improved isolation effect, helping the semiconductor structure reduce capacitance disturbance and increasing the switching speed of the switch device above the air void.

In addition, the semiconductor structure has multiple layers having different etching rates, which can facilitate the proper formation of the air void in the semiconductor structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the concept and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
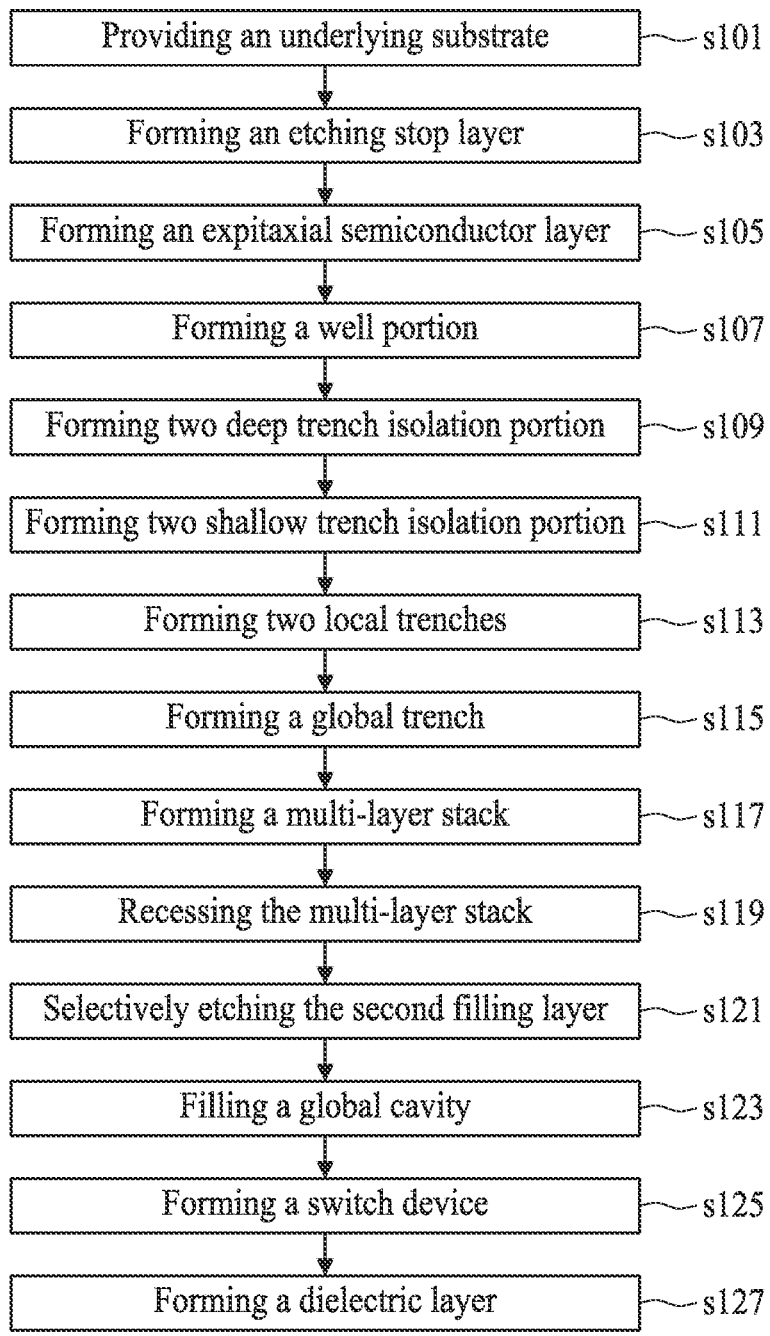
FIG. 1 is a flow diagram illustrating a method for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method for manufacturing a semiconductor structure 200 in accordance with some embodiments of the present disclosure. FIGS. 2 to 7 are schematic views illustrating stages of manufacturing the semiconductor structure 200 by the method 100 of FIG. 1 in accordance with some embodiments of the present disclosure, In some embodiments, the method 100 of FIG. 1 for manufacturing the semiconductor structure 200 includes a number of operations (S101, S103, S105, S107, S109, S111, S113, S115, S117, S119, S121, S123, S125 and S127), and the description and illustration below are not deemed as a limitation as the sequence of the operations.

Figure 2:
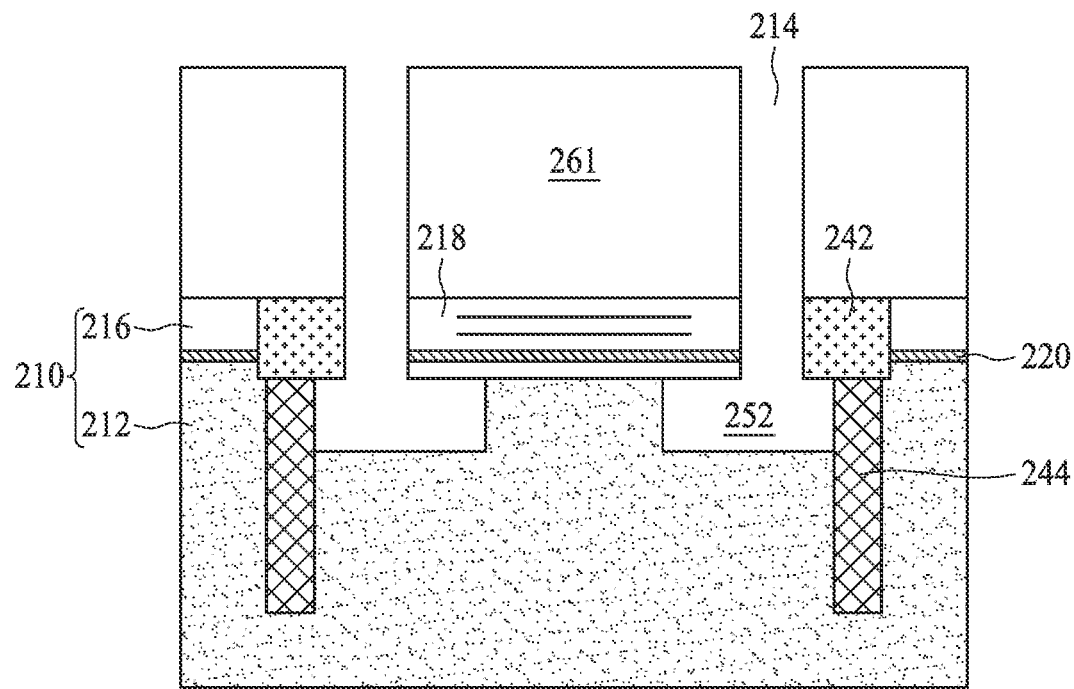
FIGS. 2 to 7 are schematic views illustrating stages of manufacturing a semiconductor structure by the method of FIG. 1 in accordance with some embodiments of the present disclosure.

In operation S101, as shown in FIG. 2, an underlying substrate 212 of a semiconductor substrate 210 is provided. The underlying substrate 212 has two through vias 214. In some embodiments, a masking layer 261 is formed over the underlying substrate 212. The through vias 214 are formed through the masking layer 261 and extend into the underlying substrate 212.

In some embodiments, the masking layer 261 may be deposited by a conventional deposition process, for example, a chemical vapor deposition (CVD) process. In some embodiments, the through vias 214 are formed through an anisotropic etching process to to remove portions below the through vias 214, for example, a wet etching process.

In some embodiments, the masking layer 261 may be a hard mask including nitride material, oxide material or other masking material. In some embodiments, the underlying substrate 212 may be formed from a substrate such as a silicon substrate, an epitaxial substrate, a silicon carbide substrate, a silicon-on-insulator (SOI) substrate or the like.

In some embodiments, the through vias 214 may be lined with a nitride, an oxide-based material, or another masking material.

In operation S103, as shown in FIG. 2, an etch stop layer 220 is formed over the underlying substrate 212. In some embodiments, the etch stop layer 220 may be deposited using any conventional deposition method, for example, a chemical vapor deposition (CND) process. In some embodiments, the etch stop layer 220 may include silicon carbide (SiC) or silicon germanium (SiGe).

In operation S105, as shown in FIG. 2, an epitaxial semiconductor layer 216 of the semiconductor substrate 210 is formed over the underlying substrate 212 of the semiconductor substrate 210. In some embodiments, the epitaxial semiconductor layer 216 is formed on the etch stop layer 220.

In some embodiments, the etch stop layer 220 may be formed using any conventional deposition method, for example, a chemical vapor deposition (CVD) process. The epitaxial semiconductor layer 216 is grown on the etch stop layer 220. In this way, the etch stop layer 220 is formed between the underlying substrate 212 and the epitaxial semiconductor layer 216.

In operation S107, as shown in FIG. 2, a well portion 218 is formed and embedded in the epitaxial semiconductor layer 216 after forming the epitaxial semiconductor layer 216 of the semiconductor substrate 210. In some embodiments, the well portion 218 may be formed in the epitaxial semiconductor layer 216 using a conventional ion implantation process, a doping process or other suitable well limning process.

In some embodiments, the well portion 218 may be either a p-doped well portion or an n-doped well portion. Whether the well portion 218 is the p-doped well portion or the n-doped well portion depends on the type of the semiconductor, for example, an NFET or a PFET.

In operation S109, as shown in FIG. 2, two deep trench isolation portions 244 are formed in the semiconductor substrate 210. More specifically, the two deep trench isolation portions 244 are formed in the underlying substrate 212. The two deep trench isolation portions 244 are formed at opposite sides of the well portion 218 to provide isolation from well charges producing harmonic distortion.

In some embodiments, the two deep trench isolation portions 244 can be formed using a conventional etching process for deep trenches, for example, a conventional lithography process, followed by a deposition process for filling the deep trenches with oxide filling material, for example, a chemical vapor deposition or a physical vapor deposition process.

In operation S111, as shown in FIG. 2, two shallow trench isolation portions 242 are formed in the semiconductor substrate 210 and respectively above the deep trench isolation portions 244. In some to embodiments, the two shallow trench isolation portions 242 are formed separate from the epitaxial semiconductor layer 216 and extend into the underlying substrate 212.

In some embodiments, the two shallow trench isolation portions 242 may be formed using conventional lithography, etching and deposition processes. In some embodiments, the shallow trench isolation portions 242 include an oxide material or other suitable insulating material.

In operation S113, as shown in FIG. 2, two local trenches 252 are formed under the two through vias 214, respectively. In some embodiments, the two local trenches 252 are formed separate from the etch stop layer 220 and extend into the underlying substrate 212. In some embodiments, the two local trenches 252 may be thrilled using conventional etching processes, such as wet etching processes or the like.

Figure 3:
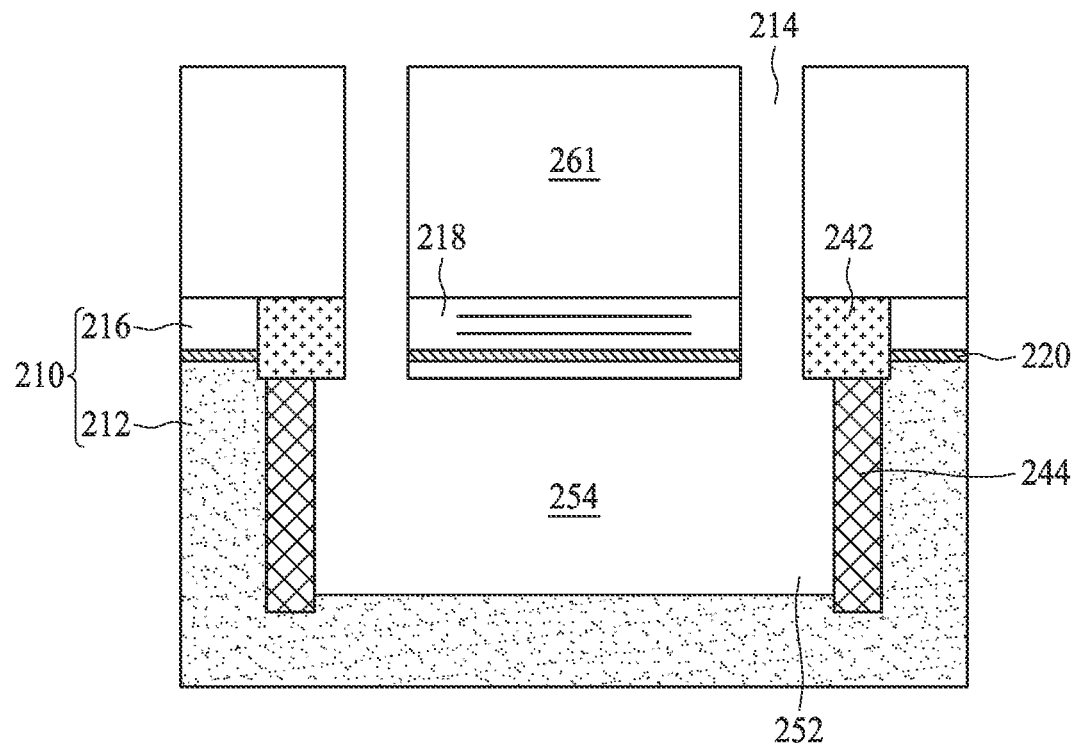

In operation S115, as shown in FIG. 3, a global trench 254 is formed between the two local trenches 252 in the underlying substrate 212 of the semiconductor substrate 210. In sonic embodiments, the global trench 254 may be formed using conventional etching processes, such as wet etching processes or the like.

Figure 4:
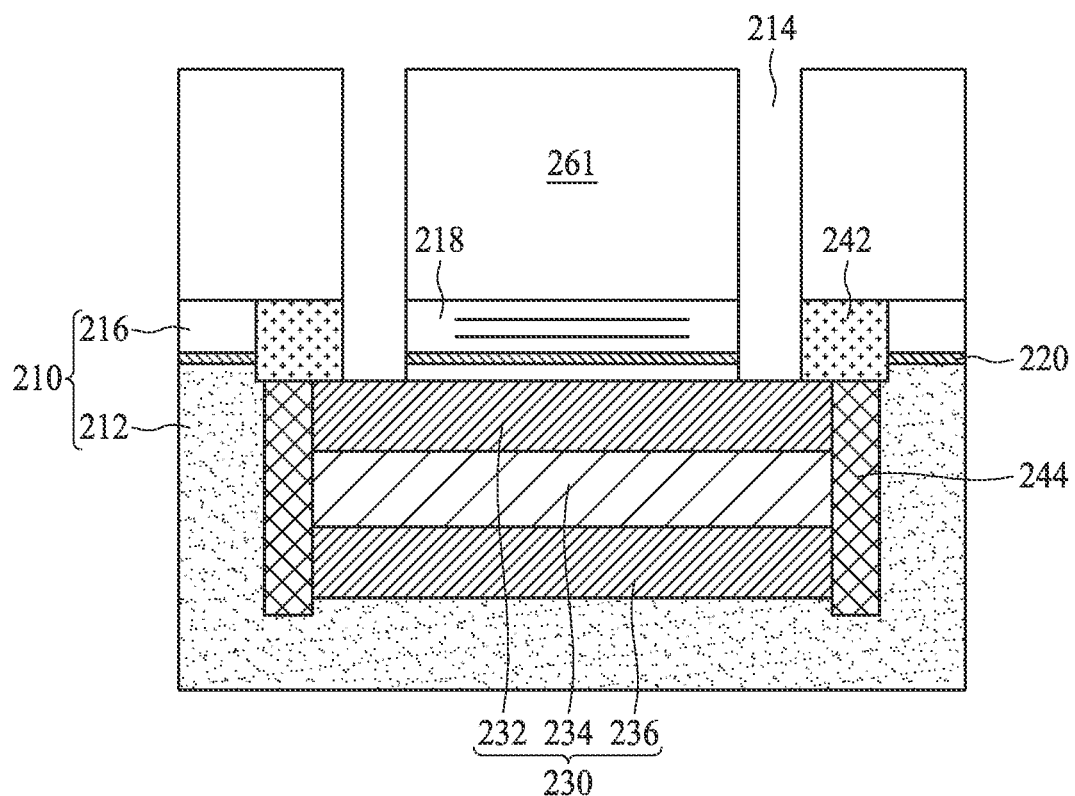

In operation S117, as shown in FIG. 4, a multi-layer stack 230 is formed in the semiconductor substrate 210. In some embodiments, the global trench 254 is filled with multiple filling materials with different etching rates to form the multi-layer stack 230. In this way, the multi-layer stack 230 has a first layer 232 and a second filling layer 234 under the first filling layer 232. In some embodiments, a third filling layer 236 of the multi-layer stack 230 is formed in the semiconductor substrate 210 beneath the second filling layer 234.

In some embodiments, as shown in FIG. 4, the multi-layer stack 230 is formed in the underlying substrate 212. The multi-layer stack 230 is formed laterally between the deep trench isolation portions 244. The etch stop layer 220 is formed between the epitaxial semiconductor layer 216 and the multi-layer stack 230. Two top portions of the multi-layer stack 230 are respectively exposed through the two through vias 214.

As shown in FIG. 4, the first filling layer 232 has a first etching rate, the second filling layer 234 has a second etching rate, and the first etching rate and the second etching rate are different. In some embodiments, the third filling layer 236 has a third etching rate different from the second etching rate. In some embodiments, the first etching rate and the third etching rate are the same. In some embodiments, the second etching rate is greater than the first etching rate and the third etching rate. In some embodiments, the first filling layer 232, the second filling layer 234 and the third filling layer 236 have different materials or different densities.

Figure 5:
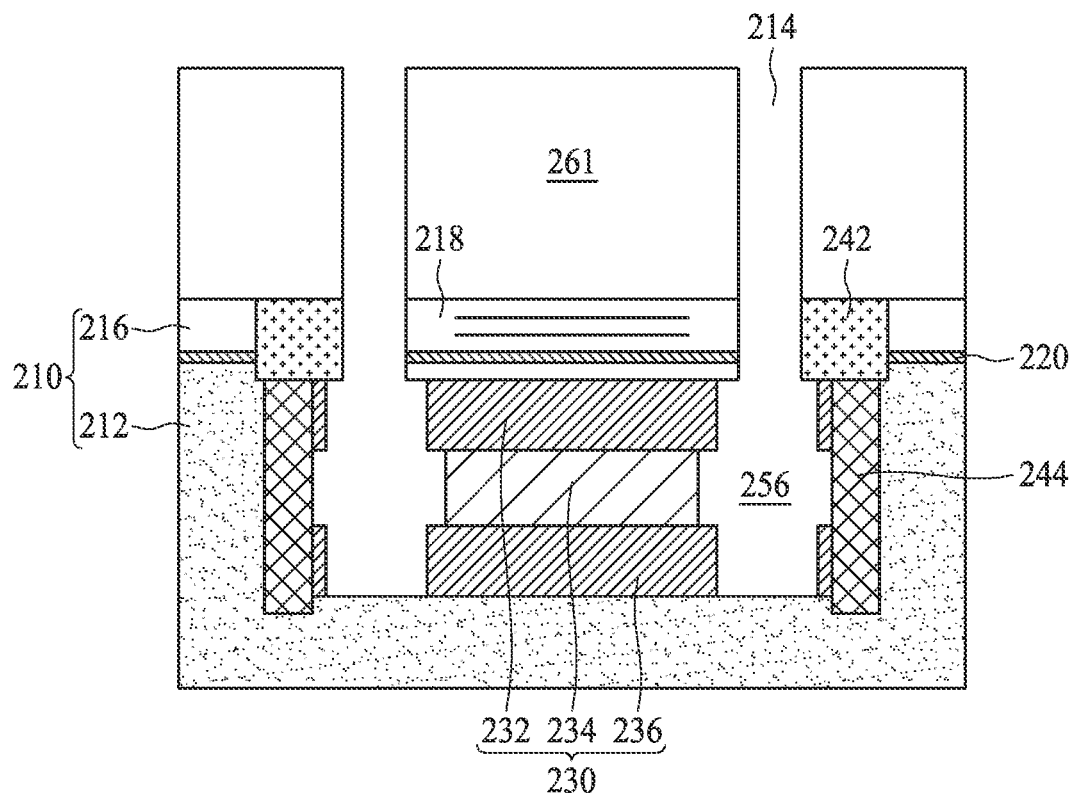

In operation S119, as shown in FIG. 5, the multi-layer stack 230 is recessed from the two through vias 214 to respectively form two blind holes 256 in the first filling layer 232 and the second filling layer 234. In some embodiments, the two blind holes 256 are formed through the first filling layer 232 and the second filling layer 234 into the third filling layer 236. In some embodiments, the multi-layer stack 230 may be formed using conventional etching processes, such as a wet etching processes or other suitable anisotropic etching processes.

Figure 6:
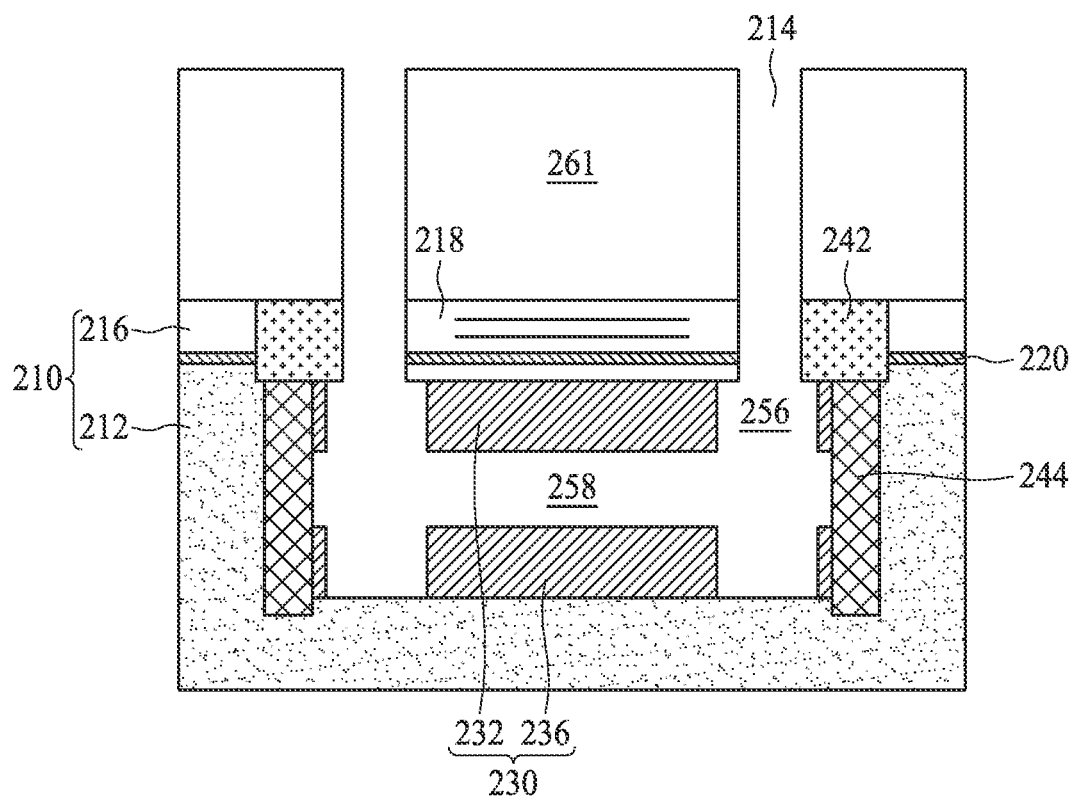

In operation S121, as shown in FIG. 6, the second filling layer 234 is selectively etched to form a global cavity 258 between the two blind holes 256 after forming the blind holes 256 in the first filling layer 232, the second filling layer 234 and the third filling layer 236.

In some embodiments, the second etching rate of the second filling layer 234 is greater than the first etching rate of the first filling layer 232 and the third etching rate of the third filling layer 236, and therefore the second filling layer 234 is etched more quickly than other filling layers to form the global cavity 258 first. In some embodiments, the global cavity 258 may be formed using conventional etching processes, such as a wet etching process or other anisotropic etching processes.

Figure 7:
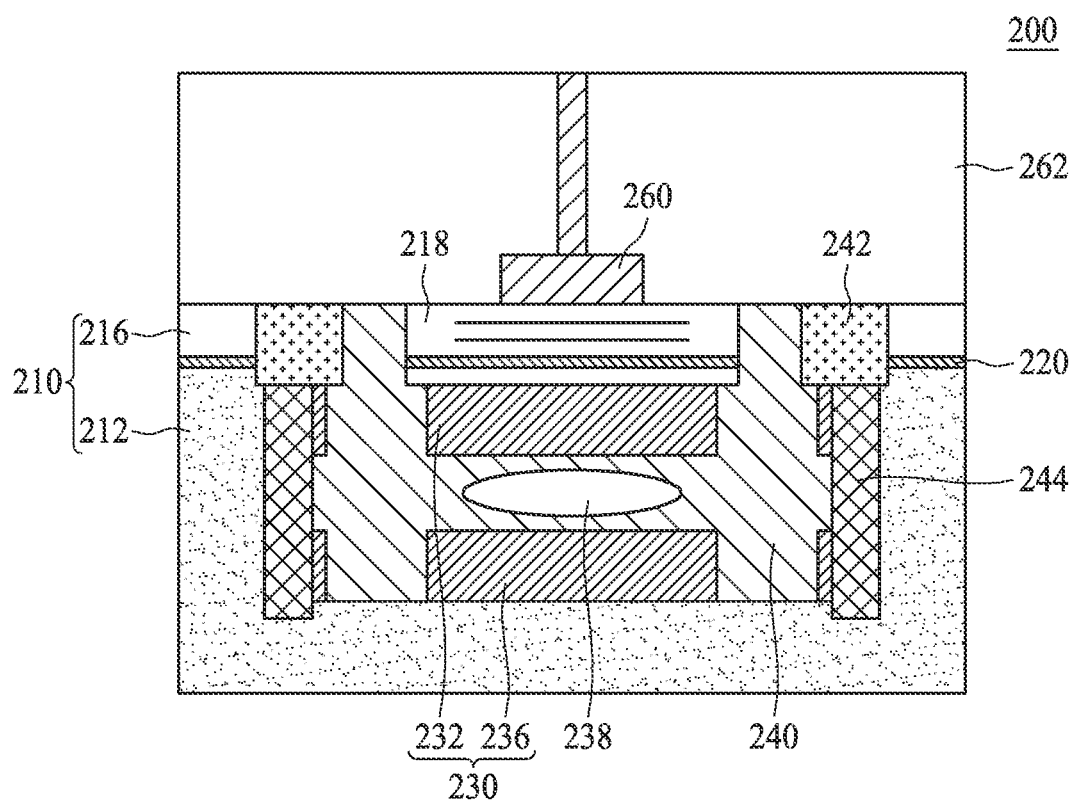

In operation S123, as shown in FIG. 7, the global cavity 258 and the two blind holes 256 are filled with dielectric filling material 240 so as to form an air void 238 in the multi-layer stack 230. The air void 238 is formed in the location of the second filling layer 234. In some embodiments, the air void 238 is surrounded by the dielectric filling material 240.

In operation S125, as shown in FIG. 7, a switch device 260 is formed over the semiconductor substrate 210, wherein the air void 238 is formed under the switch device 260. The epitaxial semiconductor layer 216 is formed between the multi-layer stack 230 and the switch device 260. The well portion 218 is formed under the switch device 260 and over the air void 238. The switch device 260 is thrilled laterally between the shallow trench isolation portions 242.

In operation S127, as shown in FIG. 7, a dielectric layer 262 is formed over the semiconductor substrate 210. The switch device 260 is surrounded by the dielectric layer 262.

As shown in FIG. 7, the semiconductor structure 200 is provided. The semiconductor structure includes the semiconductor substrate 210, the multi-layer stack 230, the switch device 260, and the air void 238. The multi-layer stack 230 is buried in the semiconductor substrate 210. The multi-layer stack 230 includes the first filling layer 232 and the second filling layer 234 under the first filling layer 232, the first filling layer 232 has the first etching rate, the second filling layer 234 has the second etching rate, and the first etching rate and the second etching rate are different. The switch device 260 is disposed over the semiconductor substrate 210. The air void 238 is thrilled in the multi-laver stack 230 and under the switch device 260. The air void 238 is surrounded by the dielectric filling material 240. The multi-layer stack 230 further includes the third filling layer 236 disposed beneath the second filling layer 234. The third filling layer 236 has a third etching rate different from the second etching rate. The second etching rate is greater than the first etching rate and the third etching rate. The air void 238 is formed in the location of the second filling layer 234.

As shown in FIG. 7, the second etching rate is greater than the first etching rate. The semiconductor substrate 210 includes the underlying substrate 212 and the epitaxial semiconductor layer 216 disposed over the underlying substrate 212. The multi-layer stack 230 is buried in the underlying substrate 212, and the epitaxial semiconductor layer 216 is disposed between the multi-layer stack 230 and the switch device 260.

As shown in FIG. 7, the well portion 218 is embedded in the epitaxial semiconductor layer 216. The well portion 218 is disposed under the switch device 260 and over the air void 238, The etch stop layer 220 is disposed between the epitaxial semiconductor layer 216 and the multi-layer stack 230.

As shown in FIG. 7, the two shallow trench isolation portions 242 are disposed in the semiconductor substrate 210. The switch device 260 is disposed laterally between the shallow trench isolation portions 242. The two deep trench isolation portions 244 are disposed in the semiconductor substrate 210 and respectively under the shallow trench isolation portions 242. The multi-layer stack 230 is disposed laterally between the deep trench isolation portions 244. The dielectric layer 262 is disposed over the semiconductor substrate 210 and surrounds the switch device 260.

In conclusion, with the design of the semiconductor structure, the semiconductor structure has an air void thrilled in the semiconductor substrate. The air void can provide the switch device with better isolation effect, thereby helping the semiconductor structure reduce capacitance disturbance and raising the switching speed of the switch device over the air void.

In addition, the semiconductor structure has multiple filling layers having different etching rates, which can facilitate the proper formation of the air void in the semiconductor structure.

One aspect of the present disclosure provides a semiconductor structure. The semiconductor structure includes a semiconductor substrate, a multi-layer stack, a switch device, and an air void. The multi-layer stack is buried in the semiconductor substrate. The multi-layer stack includes a first filling layer and a second filling layer under the first filling layer, the first filling layer has a first etching rate, the second filling layer has a second etching rate, and the first etching rate and the second etching rate are different, The switch device is disposed over the semiconductor substrate. The air void is formed in the multi-laver stack and under the switch device. The air void is surrounded by dielectric filling material.

Another aspect of the present disclosure provides a method for manufacturing a semiconductor structure. The method includes farming a multi-layer stack in the semiconductor substrate, wherein the multi-layer stack has a first filling layer and a second filling layer under the first filling layer, the first filling layer has a first etching rate, the second filling layer has a second etching rate, the first etching rate and the second etching rate are different, the semiconductor substrate has two through vias, and two top portions of the multi-layer stack are respectively exposed through the two through vias; recessing the multi-layer stack from the two through vias to respectively form two blind holes in the first filling layer and the second filling layer; selectively etching the second filling layer to form a global cavity between the two blind holes; filling the global cavity and the two blind holes with dielectric filling material so as to form an air void in the multi-layer stack; and forming a switch device over the semiconductor substrate, wherein the air void is formed under the switch device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A method for manufacturing a semiconductor structure, comprising:
   forming a multi-layer stack in a semiconductor substrate, wherein the multi-layer stack has a first filling layer and a second. filling layer under the first filling layer, the first filling layer has a first etching rate, the second filling layer has a second etching rate, the first etching rate and the second etching rate are different, the semiconductor substrate has two through vias, and two top portions of the multi-layer stack are respectively exposed through the two through vias;

recessing the multi-layer stack from the two through vias to respectively form two blind holes in the first filling layer and the second filling layer;

selectively etching the second filling layer to form a global cavity between the two blind holes;

filling the global cavity and the two blind holes with dielectric filling material to form an air void in the multi-layer stack; and forming a switch device over the semiconductor substrate, wherein the air void is formed under the switch device.

2. The method of claim 1, further comprising:
forming a third filling layer of the multi-layer stack in the semiconductor substrate beneath the second filling layer, wherein the third filling layer has a third etching rate different from the second etching rate.

3. The method of claim 1, wherein the air void is formed in the location of the second filling layer and surrounded by dielectric filling material.

4. The method of claim 1, further comprising:
forming an epitaxial semiconductor layer of the semiconductor substrate over an underlying substrate of the semiconductor substrate, wherein the multi-layer stack is formed in the underlying substrate, and the epitaxial semiconductor layer is thrilled between the multi-layer stack and the switch device.

5. The method of claim 4, further comprising:
forming a well portion embedded in the epitaxial semiconductor layer, wherein the well portion is formed under the switch device and over the air void.

6. The method of claim 4, further comprising:
forming an etch stop layer between the epitaxial semiconductor layer and the multi-layer stack.

7. The method of claim I, further comprising:
forming two deep trench isolation portions in the semiconductor substrate, wherein the multi-layer stack is formed laterally between the deep trench isolation portions; and forming two shallow trench isolation portions in the semiconductor substrate and respectively above the deep trench isolation portions, wherein the switch device is formed laterally between the shallow trench isolation portions.

8. The method of claim 1, further comprising:
forming a dielectric layer over the semiconductor substrate and surrounding the switch device.

9. The method of claim 1, further comprising:
providing an underlying substrate of the semiconductor substrate before forming a multi-layer stack in the semiconductor substrate, wherein the underlying substrate has the two through vias; and forming two local trenches respectively under the two through vias.

10. The method of claim 9, further comprising:
forming a global trench between the two local trenches in the underlying substrate of the semiconductor substrate; and filling the global trench and the two local trenches to firm the multi-layer stack in the underlying substrate of the semiconductor substrate.

* * * * *